(12) United States Patent
Park et al.

(10) Patent No.: US 11,792,916 B2
(45) Date of Patent: Oct. 17, 2023

(54) PRINTED CIRCUIT BOARD

(71) Applicant: SAMSUNG ELECTRO-MECHANICS CO., LTD., Suwon-si (KR)

(72) Inventors: Jae Han Park, Suwon-si (KR); Woo Seok Yang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 28 days.

(21) Appl. No.: 17/567,332

(22) Filed: Jan. 3, 2022

(65) Prior Publication Data

US 2023/0095087 A1 Mar. 30, 2023

(30) Foreign Application Priority Data

Sep. 27, 2021 (KR) .................. 10-2021-0127128

(51) Int. Cl.
*H05K 1/02* (2006.01)
*H05K 3/10* (2006.01)
*H05K 1/11* (2006.01)

(52) U.S. Cl.
CPC .......... *H05K 1/0224* (2013.01); *H05K 1/116* (2013.01); *H05K 3/107* (2013.01); *H05K 2201/09036* (2013.01); *H05K 2201/09636* (2013.01)

(58) Field of Classification Search
CPC ....... H05K 1/0224; H05K 3/107; H05K 1/183
See application file for complete search history.

(56) References Cited

U.S. PATENT DOCUMENTS

| 6,557,253 B1 * | 5/2003 | Haba ................... H05K 3/4092 29/874 |
| 8,134,086 B2 * | 3/2012 | Johnson ............... H05K 1/0221 174/262 |
| 2011/0232943 A1 | 9/2011 | Hida et al. |
| 2015/0257262 A1 | 9/2015 | Lee et al. |

FOREIGN PATENT DOCUMENTS

| JP | 2011-228632 A | 11/2011 |
| KR | 10-2014-0016569 A | 2/2014 |
| KR | 10-2014-0044034 A | 4/2014 |

* cited by examiner

*Primary Examiner* — Jeremy C Norris
(74) *Attorney, Agent, or Firm* — Morgan, Lewis & Bockius LLP

(57) ABSTRACT

A printed circuit board includes an insulating layer; a recess portion disposed on one surface of the insulating layer; and a circuit layer disposed on the one surface of the insulating layer and including a signal pattern and a ground pattern. At least a portion of the ground pattern covers at least a portion of the recess portion.

18 Claims, 11 Drawing Sheets

PRINTED CIRCUIT BOARD

CROSS-REFERENCE TO RELATED APPLICATION(S)

This application claims benefit of priority to Korean Patent Application No. 10-2021-0127128 filed on Sep. 27, 2021 in the Korean Intellectual Property Office, the disclosure of which is incorporated herein by reference in its entirety.

TECHNICAL FIELD

The present disclosure relates to a printed circuit board.

BACKGROUND

As integration density of a circuit has improved, a pitch between a circuit and a bump of a printed circuit board has decreased, and accordingly, difficulty of assembling a silicon die and a substrate has also increased. To improve assembly yield, as for process control items affecting assembly reliability, a control range has been reduced, which may cause a decrease in yield.

A control item of a board for improving assembly yield may include warpage control and thickness distribution control of a chip area (hereinafter, referred to as chip area thickness variation, CTV). An assembly method known as thermal compression bonding (TCB) may be applied to address assembly defects caused by warpage. In this case, the CTV may be the most important control item. The CTV may be determined by distribution of a plating thickness of an underlayer. As the number of layers of the printed circuit board increases, the accumulated distribution of the plating thickness may not be corrected afterward. Accordingly, to improve the distribution of a thickness of a chip area, it may be important to control distribution of the plating thickness of each layer.

A server central processing unit (CPU) fora data center, which has been increasingly used recently, may have an increased number of layers and a large area as compared to a general PC CPU, such that it may be difficult to control the CTV, that is, it may be difficult to control a plating thickness. Therefore, controlling a plating thickness may be an essential technique.

SUMMARY

An aspect of the present disclosure is to provide a printed circuit board having a reduced deviation in plating thickness.

Another aspect of the present disclosure is to provide a printed circuit board having a reduced deviation in plating thicknesses between an area in which vias for interlayer connection are concentrated and the other area.

Another aspect of the present disclosure is to provide a printed circuit board with a reduced deviation in plating thicknesses between a signal pattern and the other patterns.

According to an aspect of the present disclosure, a printed circuit board includes an insulating layer; a recess portion disposed on one surface of the insulating layer; and a circuit layer disposed on the one surface of the insulating layer and including a signal pattern and a ground pattern. At least a portion of the ground pattern covers at least a portion of the recess portion.

According to another aspect of the present disclosure, a printed circuit board includes an insulating layer; a circuit layer including a first metal pattern disposed on one surface of a first region of the insulating layer and a second metal pattern disposed on the one surface of a second region of the insulating layer; and a recess portion disposed in the second region of the insulating layer. At least a portion of the second metal pattern covers the recess portion, and an average thickness of the second metal pattern is greater than an average thickness of the first metal pattern.

According to another aspect of the present disclosure, a printed circuit board includes including a first region and a second region; and a circuit layer including a first metal pattern disposed on the first region, and a second metal pattern disposed on the second region. The insulating layer includes a plurality of concaves in one of the first region and the second region. A density of vias in the one of the first region and the second region is less than a density of vias in the other of the first region and the second region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
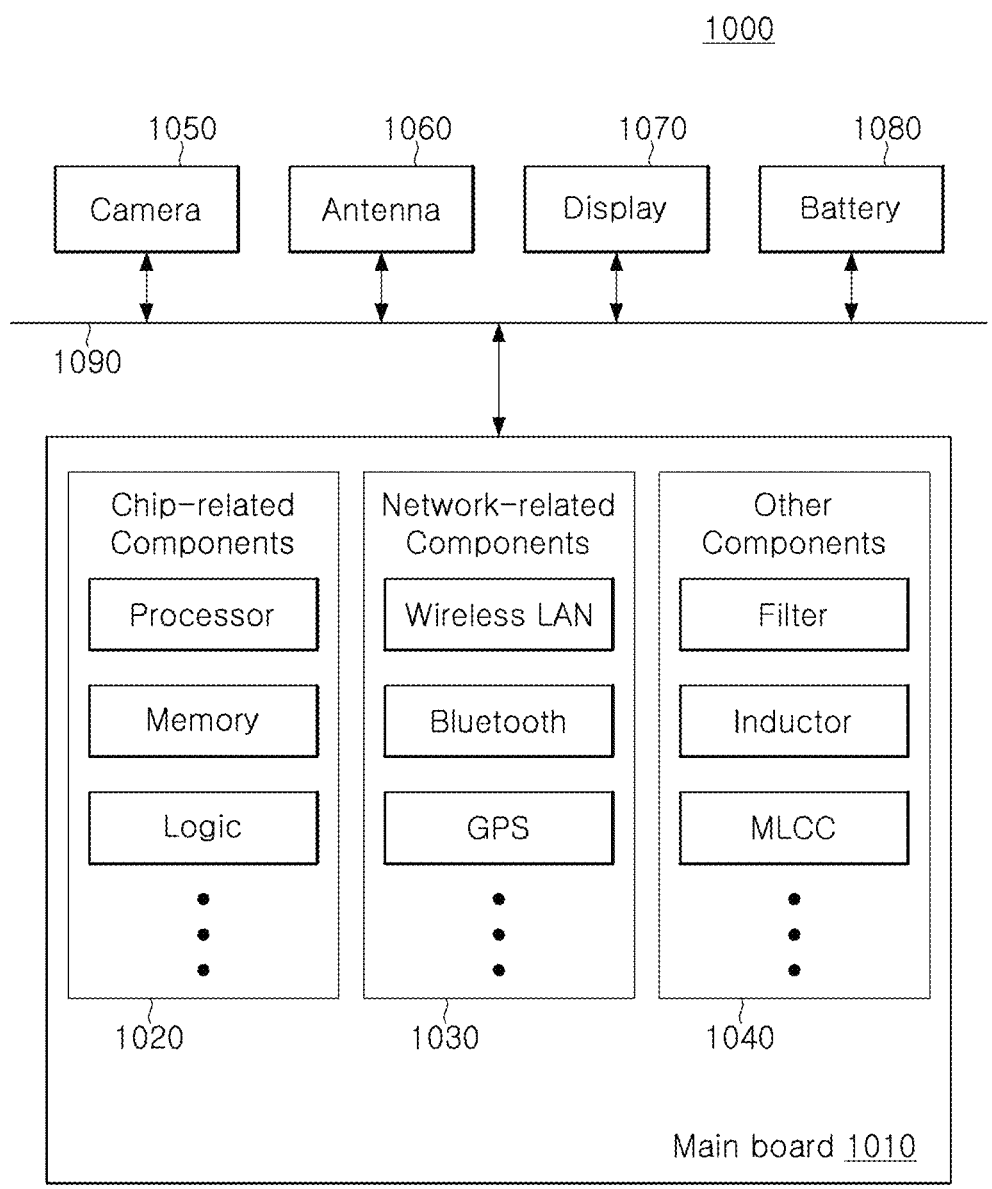
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal wirings 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, amass storage unit (for example, a hard disk drive), a compact disk (CD) drive), a digital versatile disk (DVD) drive, or the like. Also to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
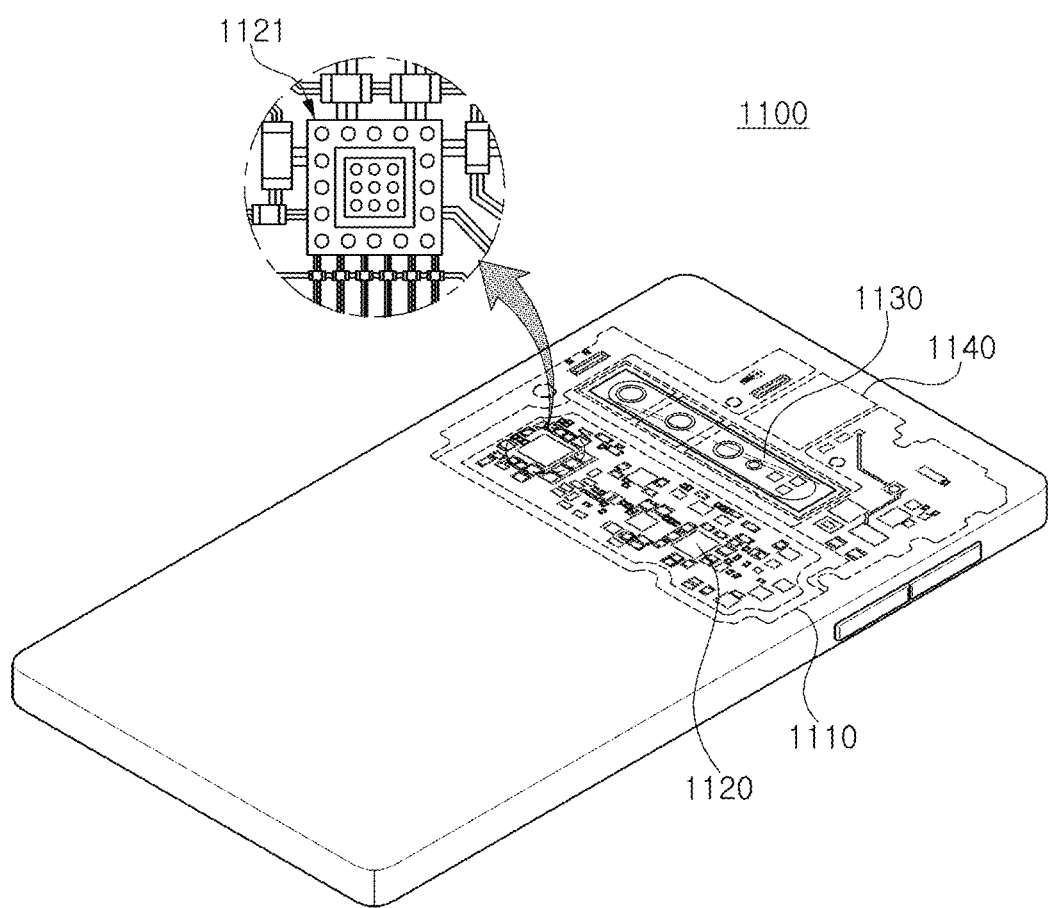
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. A portion of the components 1120 may be the chip related components, such as a printed circuit board 1121, for example, but an example embodiment thereof is not limited thereto. In the printed circuit board 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
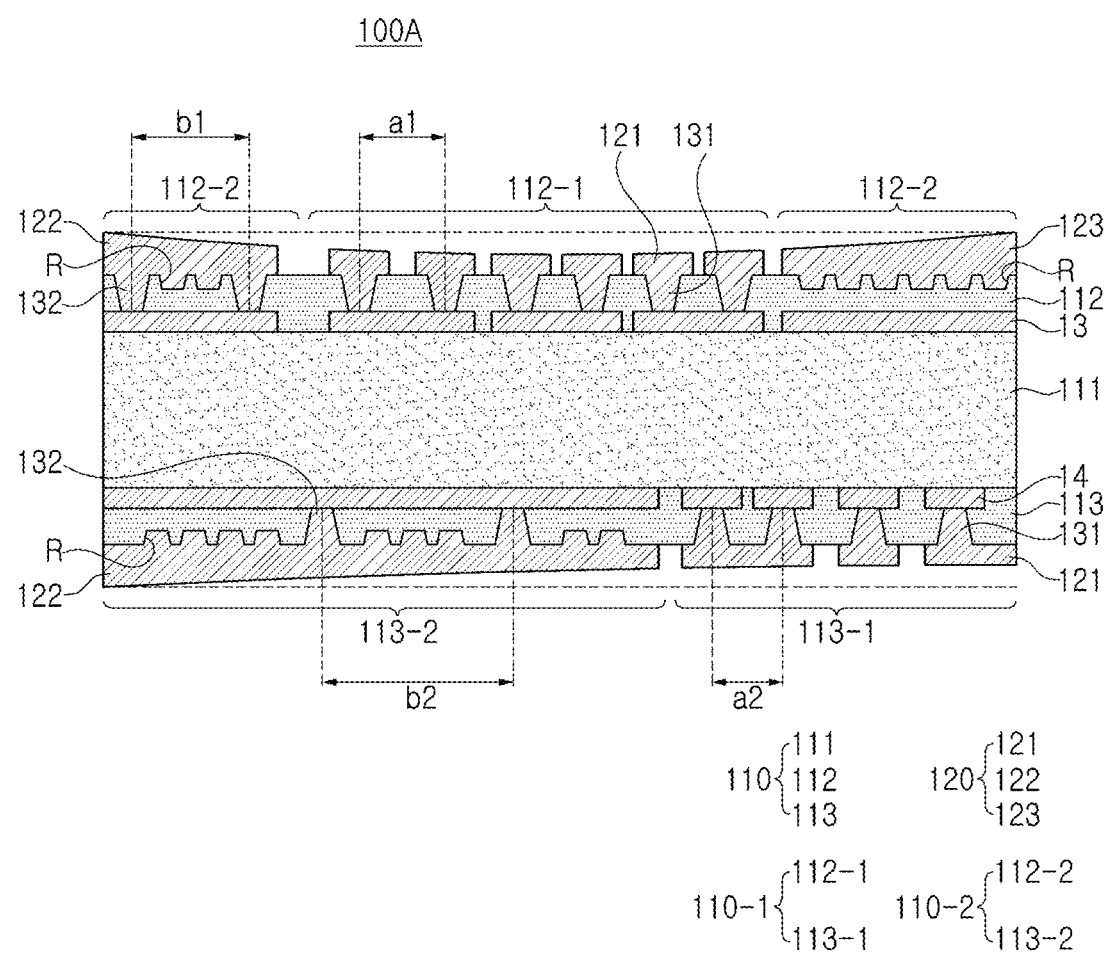
FIG. 3 is a cross-sectional diagram illustrating an example of a printed circuit board.

FIG. 3 is a cross-sectional diagram illustrating an example of a printed circuit board.

Referring to the drawing, a printed circuit board 100A according to an example embodiment may include a plurality of insulating layers 110 including first to third insulating layers 111, 112, and 113, a recess portion R formed on one surface of each of the second and third insulating layers 112 and 113, a circuit layer 120 disposed on one surface of each of the second and third insulating layers 112 and 113 and including a signal pattern 121, a ground pattern 122, and a power pattern 123, and first and second vias 131 and 132 penetrating at least a portion of each of the second and third insulating layers 112 and 113.

In the printed circuit board 100A according to an example embodiment, the first via 131 may be disposed below the signal pattern 121, and a second via 132 may be disposed below the ground pattern 122 or the power pattern 123. Also, the first vias 131 may be included in a higher density than that of the second vias 132. Accordingly, the number of first vias 131 per unit area may be greater than the number of second vias 132 per unit area.

As the first via 131 is included in a high density, the signal pattern plated and disposed on the first via 131 may have a small plating thickness. Accordingly, an average thickness of the signal pattern 121 may be smaller than an average thickness of at least one of the ground pattern 122 and the power pattern 123.

In the printed circuit board 100A according to an example embodiment, the ground pattern 122 and the power pattern 123 may at least partially cover the recess portion R formed on one surface of each of the second and third insulating layers 112 and 113. That is, the recess portion R may be formed below the ground pattern 122 or the power pattern 123, and the recess portion R may be filled with the ground pattern 122 or the power pattern 123.

As at least a portion of the ground pattern 122 or the power pattern 123 is disposed in the recess portion R, the plating thickness of the ground pattern 122 or the power pattern 123 may decrease, such that the overall thickness of the circuit board 100A may be reduced.

In the printed circuit board 100A according to an example embodiment, as the plating thickness of the ground pattern 122 or the power pattern 123 is lowered, a thickness deviation from the signal pattern 121 may be reduced.

In the printed circuit board 100A according to an example embodiment, as the recess portion R is disposed below the ground pattern 122, impedance may be easily controlled. That is, a plating thickness of the ground pattern 122 or a volume of the ground pattern 122 may be adjusted in the width direction and also the thickness direction, such that impedance matching of a product may be easily performed if desired.

In the printed circuit board 100A according to an example embodiment, the signal pattern 121 may be disposed in a first region 110-1 of the plurality of insulating layers 110, and the ground pattern 122 and the power pattern 123 may be disposed in a second region 110-2 of the plurality of insulating layers 110. Accordingly, the recess portion R may also be formed in the second region 110-2. Also, the first via 131 may be formed in the first region 110-1 of the plurality of insulating layers 110, and the second via 132 may be formed in the second region 110-2 of the plurality of insulating layers 110. In this case, the number of first vias 131 per unit area of the first region 110-1 of the plurality of insulating layers 110 may be greater than the number of second vias 132 per unit area of the second region 110-2 of the plurality of insulating layers 110. As the first region 110-1 of the plurality of insulating layers 110 includes vias having a higher density, there may be a deviation in thicknesses between the signal pattern 121 and the ground pattern 122 or between the signal pattern 121 and the power pattern 123. In the printed circuit board 100A according to an example embodiment, as the above-described recess portion R is formed in the second region 110-2, the thicknesses of the ground pattern 122 and the power pattern 123 may be reduced, and accordingly, the above-described thickness deviation may be reduced.

Hereinafter, the components of the printed circuit board 100A according to an example embodiment will be described in greater detail with reference to the drawings.

The plurality of insulating layers 110 may include first to third insulating layers 111, 112, and 113. The first insulating layer 111 may function as a core layer, and when the first insulating layer 111 is a core layer, the first insulating layer 111 may improve stiffness of the printed circuit board 100A depending on a specific material, and may control warpage of the printed circuit board 100A. Core circuit layers 13 and 14 may be disposed on one surface and the other surface of the first insulating layer 111, and a through-via hole penetrating through the first insulating layer 111 may be processed. The through-via hole may be filled with a conductive material and may electrically connect the core circuit layers 13 and 14 disposed on one surface and the other surface of the first insulating layer 111 to each other. The thickness of the first insulating layer 111 may be greater than the thickness of each of the second and third insulating layers 112 and 113. Referring to FIG. 3, the plurality of insulating layers 110 may include the first to third insulating layers 111, 112, and 113, but the plurality of insulating layers 110 may include a larger number of insulating layers.

The plurality of insulating layers 110 may include first and second regions 110-1 and 110-2. The first and second regions 110-1 and 110-2 may refer to partial regions distinct from each other when each of the plurality of insulating layers 110 in the printed circuit board 100A according to an example embodiment is viewed in the lamination direction. That is, the plurality of insulating layers 110 may include the first to third insulating layers 111, 112, and 113, and may further include an additional insulating layer (not illustrated), and each of the insulating layers 111, 112, and 113 may include first and second regions.

For example, the first insulating layer 111 may include first and second regions 111-1 and 111-2, the second insulating layer 112 may include the first and second regions 112-1 and 112-2, and the third insulating layer 113 may include first and second regions 113-1 and 113-2. Also, the first and second regions may not overlap in in the entire layers. For example, as illustrated in FIG. 3, the first region 112-1 on the second insulating layer 112 and the first region 113-1 on the third insulating layer 113 may not partially overlap each other when viewed in the lamination direction. The distinction and arrangement relationship between the first and second regions 110-1 and 110-2 will be described later.

An insulating material may be used as a material of the first insulating layer 111, and a thermosetting resin such as an epoxy resin or a thermoplastic resin such as polyimide may be used as the insulating material. Also, the above-mentioned resin including a reinforcing material such as inorganic filler as silica and glass fiber may be used. For example, a prepreg may be used as the material of the first insulating layer 111, but an example embodiment thereof is not limited thereto.

The second and third insulating layers 112 and 113 may be disposed on one surface and the other surface of the first insulating layer 111, respectively. An insulating material may be used as a material of the second and third insulating layers 112 and 113, and a thermosetting resin such as an epoxy resin or a thermoplastic resin such as polyimide may be used as the insulating material. Also, the above-mentioned resin including a reinforcing material such as inorganic filler as silica and glass fiber may be used. For example, a prepreg may be used as the material of the second and third insulating layers 112 and 113, but an example embodiment thereof is not limited thereto, and a material not including a reinforcing material such as glass fiber, such as, for example, Ajinomoto build-up film (ABF), or the like, may be used. If desired, a photosensitive insulating material such as a photo imageable dielectric (PID) may be used. Referring to FIG. 3, only the second and third insulating layers 112 and 113 may be disposed on the first insulating layer 111, but if desired, additional insulating layers may be disposed on the second and third insulating layers 112 and 113.

The core circuit layers 13 and 14 may be disposed on one surface and the other surface of the first insulating layer 111. A metal material may be used as the material of the core circuit layers 13 and 14, and as the metal material, copper (Cu), aluminum (Al), silver (Ag), tin (Sn), gold (Au), nickel (Ni), lead (Pb), titanium (Ti), or an alloy thereof may be used. The core circuit layers 13 and 14 may perform various functions according to a design. For example, the core circuit layers 13 and 14 may include a ground pattern, a power pattern, and a signal pattern. Each of the patterns may have a line shape, a plane shape, or a pad shape. The core circuit layers 13 and 14 may be formed by a plating process such as an additive process (AP), a semi AP (SAP), a modified SAP (MSAP), a tenting (TT), or the like, and accordingly, each of the core circuit layers 13 and 14 may include a seed layer, an electroless plating layer, and an electrolytic plating layer formed based on the seed layer.

The circuit layer 120 may be disposed on one surface of each of the second and third insulating layers 112 and 113. A metal material may be used as the material of the circuit layer 120, and as the metal material, copper (Cu), aluminum (Al), silver (Ag), tin (Sn), gold (Au), nickel (Ni), lead (Pb), titanium (Ti), or an alloy thereof may be used. The circuit layer 120 may perform various functions according to a design. For example, the circuit layer 120 in FIG. 3 may include a signal pattern 121, a ground pattern 122 and a power pattern 123, and each of the patterns may have a line shape, a plane shape, or a pad shape. The circuit layer 120 may be formed by a plating process such as an additive process (AP), a semi AP (SAP), a modified SAP (MSAP), a tenting (TT), or the like, and accordingly, the circuit layer 120 may include a seed layer, an electroless plating layer, and an electrolytic plating layer formed based on the seed layer.

Referring to FIG. 3, the circuit layer 120 may be disposed on one surface of each of each of the second and third insulating layers 112 and 113, and when an additional insulating layer is disposed on each of the second and third insulating layers, a larger number of the circuit layers 120 may be disposed.

Referring to FIG. 3, the signal pattern 121 of the circuit layer 120 may be disposed in the first region 110-1 of the plurality of insulating layers 110. For example, the signal pattern 121 disposed on the second insulating layer 112 may be disposed in the first region 112-1 of the second insulating layer 112, and the signal pattern 121 disposed on the third insulating layer 113 may also be disposed in the first region 113-1 of the third insulating layer 113. That is, the first regions 111-1, 112-1, and 113-1 may refer to regions of the surface of the insulating layer in which the signal pattern 121 is disposed.

The arrangement relationship between the first region 110-1 and the second region 110-2 of the plurality of insulating layers 110 is not limited to any particular example. For example, the second region 110-2 may be configured to surround the first region 110-1, and a plurality of the first regions 110-1 may be configured to be spaced apart from each other by the second region 110-2.

For example, in FIG. 3, the first region 112-1 of the second insulating layer 112 may be configured to be surrounded by the second region 112-1, and the third insulating layer 113 may be disposed such that the first region 113-1 and the second region 113-2 may divide the third insulating layer 113 into two regions and may share a side surface.

Referring to FIG. 3, the ground pattern 122 and the power pattern 123 of the circuit layer 120 may be disposed in the second region 110-2 of the plurality of insulating layers 110. For example, the ground pattern 122 and the power pattern 123 disposed on the second insulating layer 112 may be disposed in the second region 112-2 of the second insulating layer 112, and the ground pattern 122 and the power pattern 123 disposed on the third insulating layer 113 may be disposed in the second region 113-2 of the third insulating layer 113. That is, the second regions 111-2, 112-2, and 113-2 may refer to regions of the surface of the insulating layer in which the ground pattern 122 and the power pattern 123 are disposed.

Referring to FIG. 3, the first and second vias 131 and 132 may penetrate the second and third insulating layers 112 and 113, and may electrically connect the circuit layer 120 to the core circuit layers 13 and 14. Specifically, the first via 131 may electrically connect the signal pattern 121 to the core circuit layers 13 and 14, and the second via 132 may electrically connect the ground pattern 122 to the core circuit layer 13 and 14, or may electrically connect the power pattern 123 to the core circuit layers 13 and 14.

The first and second vias 131 and 132 may be filled with a metal material or a metal material may be formed along a wall surface of the via hole after the first and second via holes 131h (shown in FIG. 9) and 132h (shown in FIG. 9) are formed in the second and third insulating layers 112 and 113. A metal material may be used as a material of the first and second vias 131 and 132, and as the metal material, copper (Cu), aluminum (Al), silver (Ag), tin (Sn), and gold (Au), nickel (Ni), lead (Pb), titanium (Ti), or an alloy thereof may be used. The first and second vias 131 and 132 may include signal vias, ground vias, and power vias, according to a design. The first and second vias 131 and 132 may also be formed by a plating process, such as, for example, AP, SAP, MSAP, TT, or the like, and may include a seed layer, an electroless plating layer, and an electrolytic plating layer formed based on the seed layer. With respect to the first insulating layer 111, the first and second vias 131 and 132 disposed on one side may have a tapered shape in which a width of an upper surface is greater than a width of a lower surface, and with respect to the first insulating layer 111, the first and second vias 131 and 132 disposed on the other surface side may have a tapered shape in which a width of a lower surface is greater than a width of an upper surface. That is, the first and second vias 131 and 132 may have shapes tapered in opposite directions with respect to the first insulating layer 111.

Referring to FIG. 3, since the signal pattern 121 is disposed in the first region 112-1 of the second insulating layer 112, the first via 131 penetrating through the second insulating layer 112 may also be disposed in the first region 112-1 of the second insulating layer 112. Also, since the ground pattern 122 and the power pattern 123 are disposed in the second region 112-2 of the second insulating layer 112, the second via 132 penetrating through the second insulating layer 112 may also be disposed in the second region 112-2 of the second insulating layer 112. Also, since the signal pattern 121 is disposed in the first region 113-1 of the third insulating layer 113, the first via 131 penetrating through the third insulating layer 113 may also be disposed in the first region 113-1. Also, since the ground pattern 122 is disposed in the second region 113-2 of the third insulating layer 113, the second via 132 penetrating through the third insulating layer 113 may also be disposed in the second region 113-2.

Accordingly, the first via 131 may penetrate at least a portion of the first region 110-1 in each of the plurality of insulating layers 110, and the second via 132 may penetrate second region 110-2 in each of the plurality of insulating layers 110.

Referring to FIG. 3, an average of the shortest distances between first vias 131 adjacent to each other may be smaller than an average of the shortest distances between second vias adjacent to each other. That is, the first vias 131 may be disposed relatively densely as compared to the second vias 132, and the first vias 131 may be disposed in a higher density than the second vias 132.

Referring to FIG. 3, for example, the average of the shortest distances a1 between first vias 131 adjacent to each other in the second insulating layer 112 may be less than the average of the shortest distance b1 between the second vias 132 adjacent to each other in the second insulating layer 112. Also, the average of the shortest distances a2 between the first vias 131 adjacent to each other in the third insulating layer 113 may be less than the average of the shortest distances b2 between the second vias adjacent to each other in the third insulating layer 113.

In the example embodiment, the "shortest distance" between vias adjacent to each other may refer to a length of a linear line connecting the central axes of the vias adjacent to each other by the shortest distance in the horizontal direction.

In the example embodiment, the "central axis" of a via may refer to a length of a linear line connecting the center of gravity of one surface of the via to the center of gravity of the other surface of the via by the shortest distance in the vertical direction, when the printed circuit board 100A is placed on a horizontal plane such that a major surface of the printed circuit board 100A faces the horizontal plane.

Also, the number of vias formed in the first region 110-1 in each of the plurality of insulating layers 110 may be greater than the number of vias formed in the second region 110-2.

For example, in the second insulating layer 112, the number of first vias 131 formed in the first region 112-1 may be greater than the number of second vias 132 formed in the second region 112-2. Also, in the third insulating layer 113, the number of first vias 131 formed in the first region 113-1 may be greater than the number of second vias 132 formed in the second region 113-2.

As described above, in the first regions 112-1 and 113-1 of the second and third insulating layers, the first vias 131 formed in relatively high density may be disposed, such that the signal pattern 121 disposed on the first regions 112-1 and 113-1 of the second and third insulating layers may have a reduced thickness as compared to the pattern disposed on the second regions 112-1 and 113-2, which may be caused by the phenomenon in which, as a plating solution flows into the first via hole 131h during the plating process for the signal pattern 121 and the first via 131, such that the amount of the plating solution of the signal pattern 121 disposed on the first via 131 may be relatively reduced, and the amount of the plating layer on the signal pattern 121 decreases.

However, since the second vias 132 having a relatively low density are disposed in the second regions 112-2 and 113-2 of the second and third insulating layers, the ground pattern 122 or the power pattern 123 disposed on the second regions 112-2 and 113-2 may have a relatively thick thickness. Even during the plating process for the ground pattern 122, the power pattern 123, and the second via 132, the plating solution may flow into the second via hole 132h and may affect the amount of the plating solution of the ground pattern 122 and the power pattern 123 disposed on the second via 132, but as described above, since the second vias 132 are not densely disposed as the first vias 131, the amount of the plating solution of the ground pattern 122 and the power pattern 123 may be less affected.

That is, in the signal pattern 121 disposed in the first regions 112-1 and 113-1 of the second and third insulating layers, since the first vias 131 is densely disposed, the thickness thereof may be greatly reduced. However, as for the ground pattern 122 and the power pattern 123 disposed in the second regions 112-2 and 113-2 of the second and third insulating layers, since the second via 132 is relatively evenly distributed, the thickness thereof may be relatively less reduced.

Accordingly, there may be a deviation in thicknesses between the signal pattern 121 and the ground pattern 122, and there may be a deviation in thicknesses between the signal pattern 121 and the power pattern 123.

Although not specifically referred to as an average thickness, in the example embodiment, the term "thickness" does not indicate a thickness in one region, and may refer to an average value of thicknesses of a plurality of regions of the corresponding component. For example, the "thickness of the signal pattern 121" may refer to an average value of the measured values of the shortest distance between one surface and the other surface of the signal pattern 121 opposing each other in the thickness direction in a plurality of five regions of the signal pattern 121.

In the example embodiment, to prevent the deviation in thicknesses caused by the decrease in the thickness of the signal pattern 121 and the increase in the thickness of the ground pattern 122 and the power pattern 123 as described above, the recess portion R may be formed in the second region 110-2.

Referring to FIG. 3, the recess portion R may be formed on one surface of each of the second and third insulating layers 112 and 113. The recess portion R may refer to a region recessed inwardly from one surface of each of the second and third insulating layers 112 and 113, and a depth of the recess portion R may be less than the thickness of each insulating layer in which the recess portion R is formed, and accordingly, the recess portion R may have a shape in which four closed side surfaces are open toward one side.

Also, the recess portion R may be formed in each of the second regions 112-2 and 113-2 of the second and third insulating layers 112 and 113. Also, the recess portion R may be covered by the ground pattern 122 or the power pattern 123 disposed on the second regions 112-2 and 113-2 of the second and third insulating layers 112 and 113, and the recess portion R may be filled with at least a portion of the ground pattern 122 or the power pattern 123.

As such, in the printed circuit board 100A according to the example embodiment, since at least a portion of the ground pattern 122 or the power pattern 123 is disposed in the recess portion R, the thickness of the ground pattern 122 and the power pattern 123 may be reduced. Accordingly, an effect of reducing deviation in thickness caused by a difference in density between the first and second vias 131 and 132 may be obtained.

For example, the average thickness of at least one of the ground pattern 122 and the power pattern 123 may be greater than the average thickness of the signal pattern 121, but in the printed circuit board 100A according to the example embodiment, by reducing the difference between the average thickness of at least one of the ground pattern 122 and the power pattern 123 and the average thickness of the signal pattern 121, flatness of the entire printed circuit board 100A may increase, and accordingly, when the printed circuit board 100A includes multiple layers, warpage of the entire board may be controlled.

A plurality of the recess portion R may be provided and spaced apart from each other in the second region 110-2 of the plurality of insulating layers 110. Each of the recess portions R may be formed by the same method during the process of forming the first and second vias 131 and 132, and accordingly, an additional process may not be necessary. Accordingly, the recess portion R may be further formed without adding another process.

The shape of the recess portion R may refer to a plurality of regions spaced apart from each other in the form of an island, and each recess portion R may have a concave shape extending in a predetermined direction. Also, when the recess portion R has a shape recessed inwardly from one surface of the second and third insulating layers 112 and 113, the shape is not limited to any particular shape.

The average shortest distance between the recess portions R spaced apart from each other is not limited to any example, and considering that the depth of the recess portion R is less than the depth of the first and second vias 131 and 132, the average shortest distance may be less than the average shortest distance between the first vias 131 or the average shortest distance between the second vias adjacent to each other. Accordingly, the number of the recess portions R may be greater than the number of the second vias 131 in the second region 122, and the plurality of recess portions R may surround a single second via 132. As the plurality of recess portions R surround a single second via 132, an effect of compensating for the deviation in thicknesses caused by a difference in density between the first and second vias 131 and 132 may be obtained.

Figure 4:
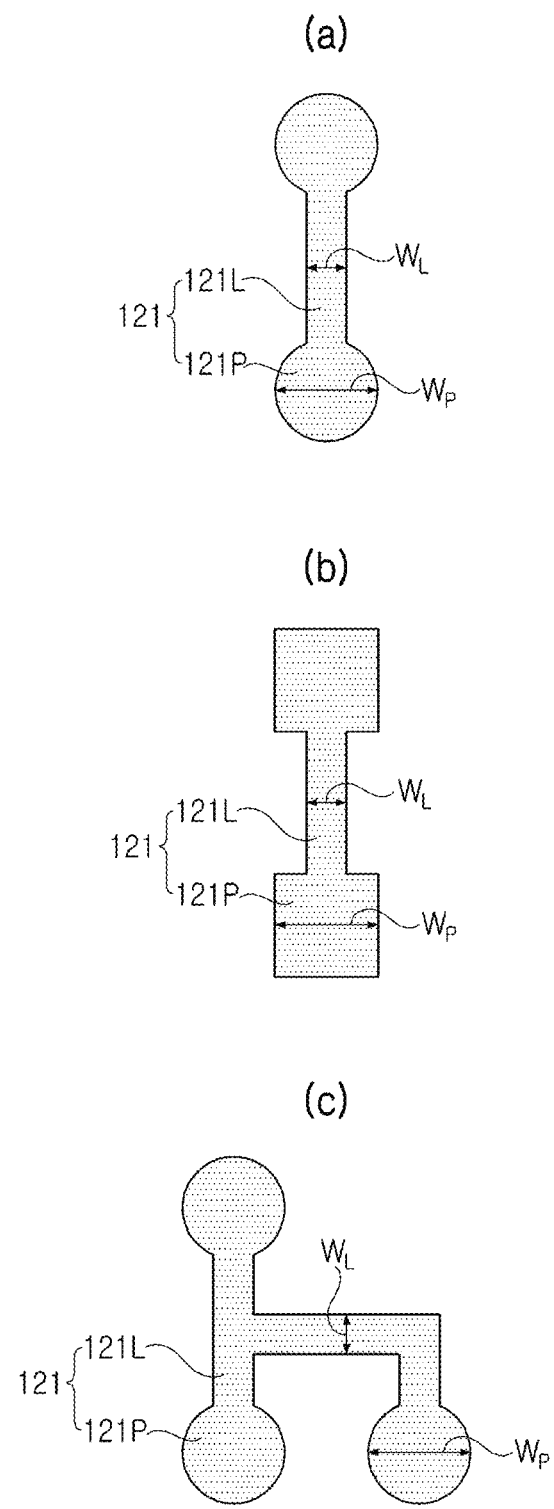
FIG. 4 is a plan diagram illustrating a signal pattern according to an example embodiment of the present disclosure, viewed from above.

FIG. 4 is a plan diagram illustrating a signal pattern according to an example embodiment of the present disclosure, viewed from above.

FIG. 4 (a), 4 (b) and 4 (c) are various plan diagrams in which the signal pattern 121 in the printed circuit board 100A according to the example embodiment is viewed in the thickness direction.

Referring to FIG. 4 (a), the signal pattern 121 may include a signal wiring 121L and a signal pad 121P connected to both ends of the signal wiring 121L. The signal pad 121P may be connected to and in contact with each of one end and the other end of the signal wiring 121L, and an average width of the signal pad 121P may be greater than an average width of the signal wiring 121L.

In the example embodiment of the width of the signal pattern 121, the term "width" may refer to the longest length among lengths in a vertical direction on the same plane disposed in the same direction in which the signal wiring 121L extends. Also, the "average width" may be obtained by measuring the lengths in the vertical direction in five regions evenly distributed on the same plane disposed in the same direction in which a specific component extends and obtaining an average of the lengths.

Therefore, referring to FIG. 4 (a), the longest distance among the lengths in the vertical direction (in FIG. 4 (a), the left-right direction) on the same plane disposed in the direction (in FIG. 4 (a), the up-down direction) in which the signal wiring 121L extends may be $W_L$, and accordingly, the width of the signal wiring 121L may be $W_L$, and as for the signal pad 121P, the longest distance among the lengths in the vertical direction on the same plane disposed in the direction in which the signal wiring 121L extends may be $W_P$, the width of the signal pad 121P may be $W_P$. As illustrated, since $W_P$ is greater than $W_L$, the width of the signal pad 121P may be greater than the width of the signal wiring 121L.

The average width of the signal wiring 121L may be $W_L$, and the average width of the signal pad 121P may be smaller than $W_P$ and may be larger than $W_L$. Accordingly, the average width of the signal pad 121P may be greater than the average width of the signal wiring 121L.

FIG. 4(b) illustrates a signal pattern 121 including a signal pad 121P having a shape different from that of the example in FIG. 4 (a). As in the example illustrated in FIG. 4 (b), the signal pad 121P may have various shapes. For example, the signal pad 121P may have a circular cross-sectional surface as in FIG. 4(a) or may have a rectangular shape as in FIG. 4(b) when viewed in the thickness direction, but an example embodiment thereof is not limited thereto. The signal pad 121P may have a cross-sectional surface of a polygon or a figure surrounded by a closed curve.

FIG. 4(c) illustrates a signal pattern 121 including a signal wiring 121L having a shape different from the examples in FIGS. 4(a) and 4(b). As illustrated in the example illustrated in FIG. 4 (c), the signal wiring 121L may not simply extend in one direction, and may have a branching point to have a plurality of lines, and may have a shape extending in different directions. Also in this case, the width of the signal wiring 121L may refer to a distance in a vertical direction on the same plane disposed in the direction in which each portion of the signal wiring 121L extends. Even when the signal wiring 121L has a branch point and is divided into a plurality of lines as illustrated in FIG. 4 (c), the signal pad 121P may be connected to an end of each signal wiring 121L.

The signal pad 121P may be in contact with and connected to a via for interlayer connection, and may function as a terminal for electrically connecting the signal wiring 121L of each layer to the signal wiring of another layer.

Figure 5:
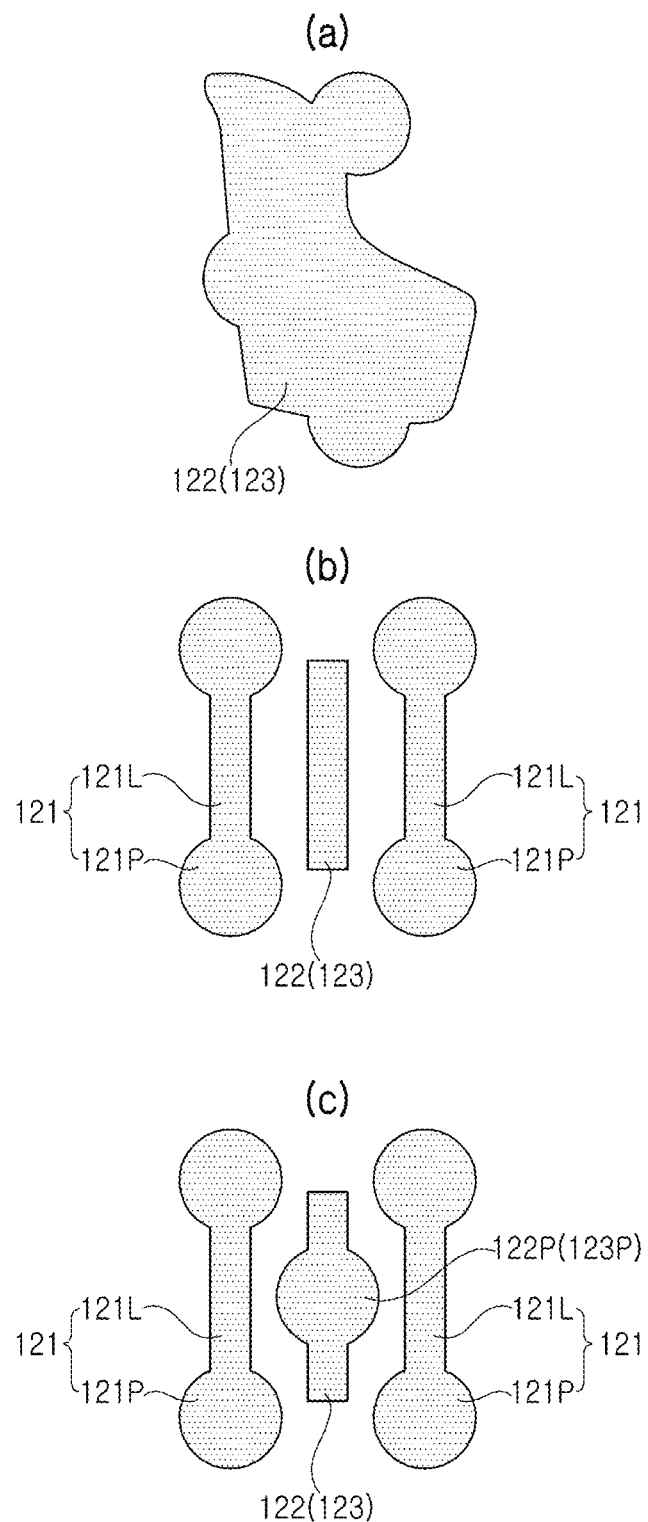
FIG. 5 is a plan diagram illustrating a ground pattern and a power pattern as compared to a signal pattern according to an example embodiment of the present disclosure, viewed from above.

FIG. 5 is a plan diagram illustrating a ground pattern and a power pattern compared to a signal pattern according to an example embodiment, viewed from above FIGS. 5(a), 5 (b) and 5 (c) are plan diagrams illustrating the examples in which the ground pattern 122 and the power pattern 123 are viewed in the thickness direction as compared to the signal pattern 121 in the printed circuit board 100A according to the example embodiment.

FIG. 5(a) illustrates a plan view of an example in which the ground pattern 122 or the power pattern 123 is viewed in the thickness direction. The shape of the cross-section of the ground pattern 122 or the power pattern 123 is not limited to any particular shape, and may have a cross-sectional surface of a polygon or a figure surrounded by a closed curve.

As an example, but not limited thereto, the ground pattern 122 or the power pattern 123 may have an area larger than that of the signal pattern 121 described above. Since the ground pattern 122 or the power pattern 123 has a large area, functions such as electromagnetic interference (EMI) shielding and power supply may be effectively performed.

Referring to FIG. 5(b), the ground pattern 122 or the power pattern 123 may have a shape extending in one direction, and in the example in FIG. 5(b), a portion of the ground pattern 122 or the power pattern 123 disposed between the signal patterns 121 may be cut out.

The ground pattern 122 or the power pattern 123 in FIG. 5 (b) may have a shape extending in one direction, similarly to the signal wiring 121L of the signal pattern 121. Differently from the signal pattern 121, pads may not be connected to both ends of the ground pattern 122 or the power pattern 123.

The example in FIG. 5 (c) illustrates an example in which the ground pattern 122 or the power pattern 123 may include the ground pad 122P or the power pad 123P.

Even when the ground pattern 122 or the power pattern 123 includes the pads 122P or 123P, the pads 122P or 123P may not be disposed on both ends of the ground pattern 122 or the power pattern 123, and instead, the pads 122P or 123P may be disposed in an arbitrary area in the ground pattern 122 or the power pattern 123.

FIGS. 6 to 11 are process diagrams illustrating a process of manufacturing the printed circuit board in FIG. 3.

Figure 6:
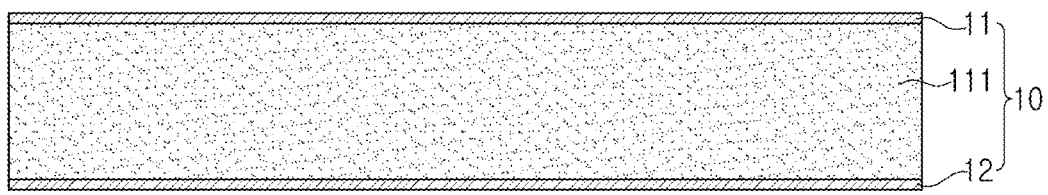
FIGS. 6 to 11 are process diagrams illustrating processes of manufacturing the printed circuit board in FIG. 3.

Referring to FIG. 6, a copper clad laminate 10 including a first insulating layer 111 and first and second copper foils 11 and 12 disposed on both surfaces of the first insulating layer 111 may be provided.

Figure 7:
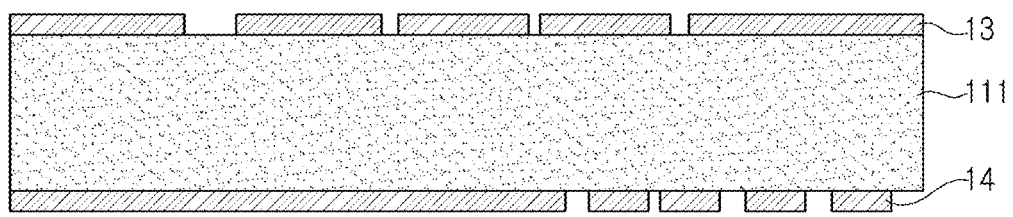

Referring to FIG. 7, an electrolytic plating layer may be disposed on the first and second copper foils 11 and 12 through electroplating using the first and second copper foils 11 and 12 as seed layers, and exposing/developing of the electrolytic plating layer may be performed, such that the core circuit layers 13 and 14 may be formed. The core circuit layers 13 and 14 may be a signal pattern, a ground pattern, and a power pattern in example embodiments.

Figure 8:
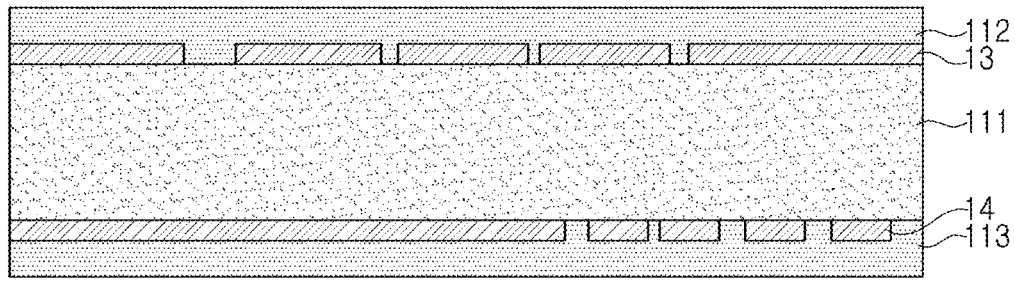

Referring to FIG. 8, second and third insulating layers 112 and 113 may be disposed on one surface and the other surface of the first insulating layer 1111, respectively, to cover the core circuit layers 13 and 14.

Figure 9:
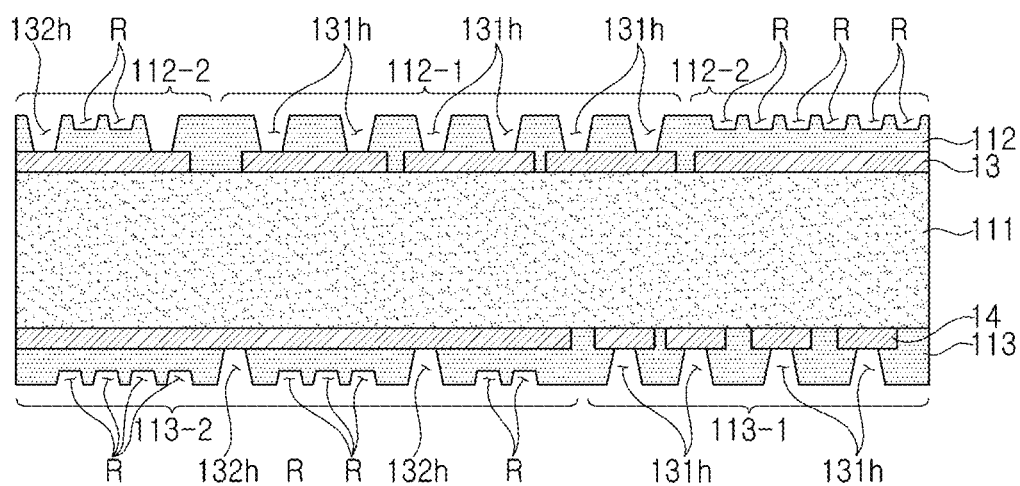

Referring to FIG. 9, the first via hole 131h, the second via hole 132h and the recess portion R may be formed on one surface of each of the second and third insulating layers 112 and 113 through a general insulating material processing method such as laser processing. When the second and third insulating layers 112 and 113 include a photosensitive insulating material, the first via hole 131h, the second via hole 132h, and the recess portion may be formed using an exposure/development method rather than a laser processing method.

As illustrated in FIG. 9, the recess portion R may not entirely penetrate the second and third insulating layers 112 and 113. That is, differently from the first and second via holes 131h and 132h penetrating through the second and third insulating layers 112 and 113 and exposing at least a portion of the core circuit layers 13 and 14, the recess portion R may have a less depth. That is, the recess portion R may have a depth less than that of the first and second via holes 131h and 132h. The recess portion R and the first and second via holes 131h and 132h may have a tapered shape of which a width decreases inwardly from one surface of each of the second and third insulating layers 112 and 113.

Also, as illustrated in FIG. 9, the first via hole 131h may be formed in the first region 110-1, and the second via hole 132h may be formed in the second region 110-2. For example, the first via hole 131h may be formed in the first region 112-1 of the second insulating layer 112, and the second via hole 131h may be formed in the second region 112-2 of the second insulating layer 112. Also, the first via hole 131h may be formed in the first region 113-2 of the third insulating layer 113, and the second via hole 131h may be formed in the second region 113-2 of the third insulating layer 113.

Figure 10:
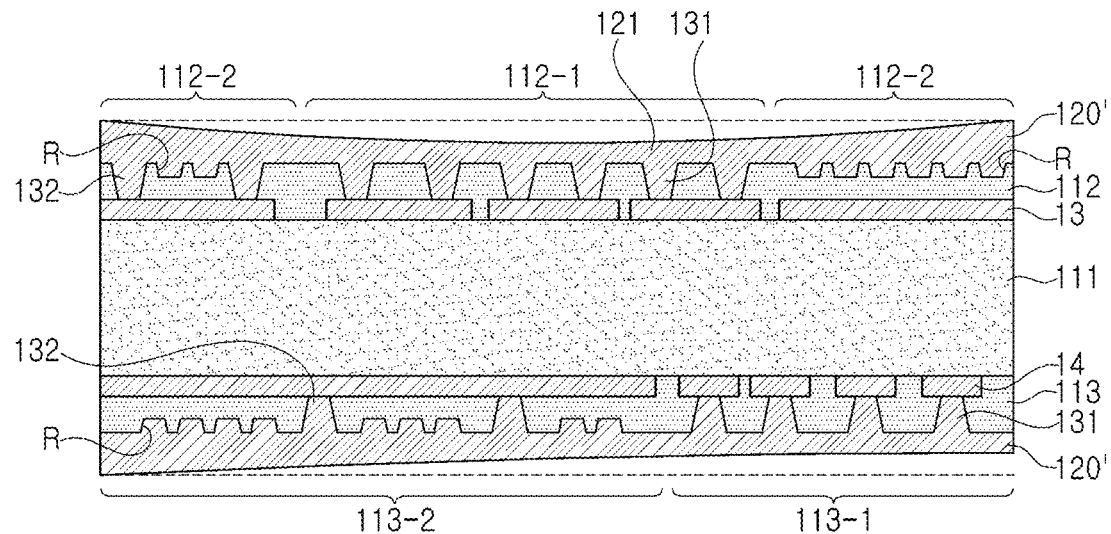

Referring to FIG. 10, the plating layer 120' may be disposed by performing electroless plating and electroplating in order on one surface of each of the second and third insulating layers 112 and 113. The plating layer 120' may fill the first and second via holes 131h and 132h and the recess portion R, and accordingly, the first and second vias 131 and 132 may be formed.

As described above, the average of the shortest distances between the first vias 131 adjacent to each other in the first region 110-1 may be less than the average of the shortest distances between the second vias adjacent to each other in the second region 110-2.

Figure 11:
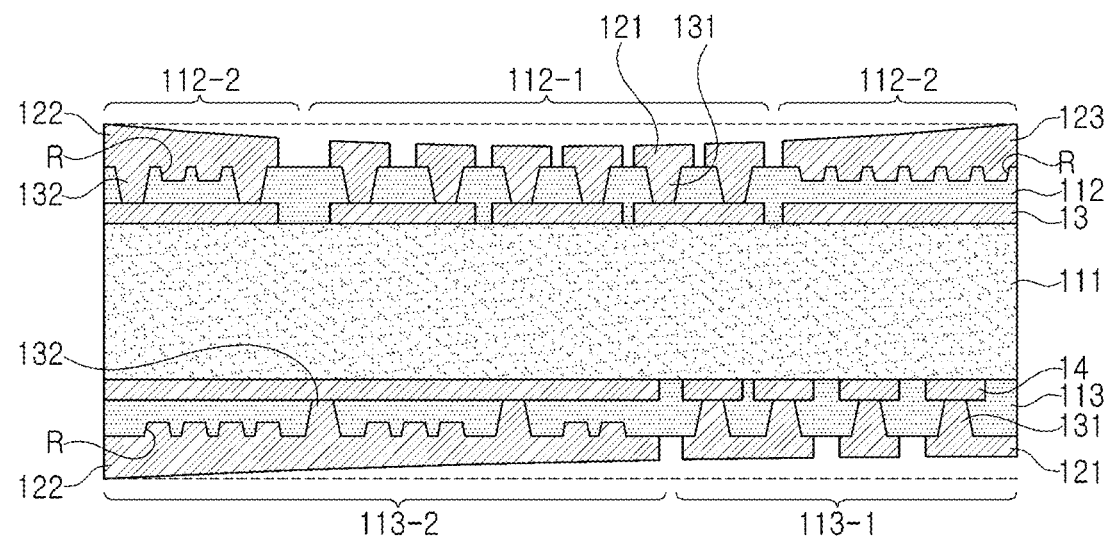

Referring to FIG. 11, a process of patterning the plating layer 120' may be performed by performing a plating resist and an etching process. Through the patterning of the plating layer 120', a signal pattern 121, a ground pattern 122, and a power pattern 123 may be formed.

Figure 12:
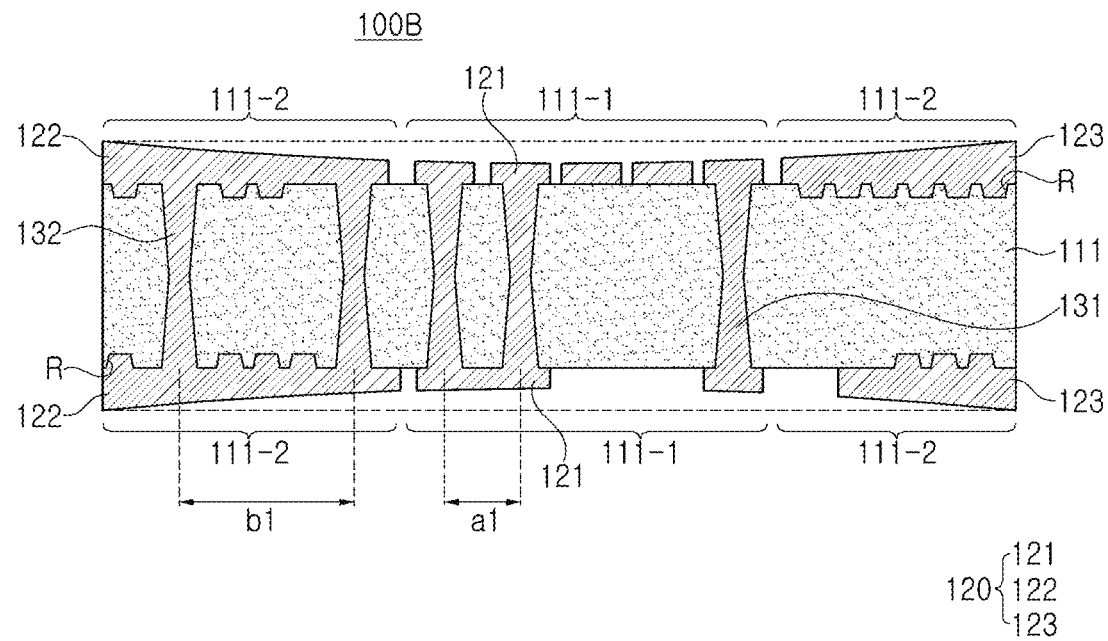
FIG. 12 is a cross-sectional diagram illustrating another example of a printed circuit board.

FIG. 12 is a cross-sectional diagram illustrating another example of a printed circuit board.

The printed circuit board 100B according to another example embodiment may be different from the printed circuit board 100A according to the aforementioned example embodiment in that the recess portion R and the first and second vias 131 and 132 are formed in the first insulating layer 111. In the description below, only the differences from the printed circuit board 100A according to the aforementioned example embodiment will be described, and overlapping description will not be provided.

Referring to FIG. 12, the first insulating layer 111 may function as a core layer. Also, a circuit layer 120 may be disposed on each of one surface and the other surface of the first insulating layer 111, and the circuit layer 120 may include a signal pattern 121, a ground pattern 122, and a power pattern 123. The signal pattern 121 may be disposed in the first region 111-1 on the first insulating layer 111, and the ground pattern 122 and the power pattern 123 may be disposed in the second region 11-1 on the first insulating layer 111.

Each of the first and second vias 131 and 132 may penetrate at least a portion of the first insulating layer 111.

As in the printed circuit board 100A according to the aforementioned example embodiment, the first via 131 may be formed in the first region 111-1 of the first insulating layer, and the second via 132 may be formed in the second region 111-2 of the first insulating layer.

The recess portion R may be formed in the second region 111-2 of the first insulating layer 111 and may be disposed below the ground pattern 122 or the power pattern 123. The recess portion R may have a shape recessed inwardly from one surface and the other surface of the first insulating layer 111, and the recess portion R may be filled with the ground pattern 122 or the power pattern 123.

Also in the printed circuit board 100B according to another example embodiment, density of the first vias 131 disposed in the first region 111-1 may be higher than density of the second vias 132 disposed in the second region 111-2. Also, an average value of the shortest distances a1 between first vias 131 adjacent to each other may be smaller than an average value of the shortest distances b1 between second vias adjacent to each other. Accordingly, the first via 131 may be more densely disposed than the second via 132.

That is, as the via having higher density is disposed in the first region 111-1, the plating thickness of the signal pattern 121 disposed in the first region 111-1 may decrease, such that a deviation in thicknesses between the signal pattern 121 and the ground pattern 122 and between the signal pattern 121 and the power pattern 123.

In the example embodiment, as the recess portion R is formed in the first insulating layer 111 below the ground pattern 122 and the power pattern 123, at least a portion of each the ground pattern 122 and the power pattern 123 may fill the recess portion R, and accordingly, the thickness of the ground pattern 122 and the power pattern 123 may be reduced.

Accordingly, the thickness of the printed circuit board 100B may be reduced, and as the deviation in the plating thickness between the ground pattern 122 and the power pattern 123 and the signal pattern 121 is reduced, flatness of the printed circuit board 100B may increase such that warpage may be easily controlled.

Also, as the recess portion R is disposed below the ground pattern 122 in the printed circuit board 100B according to an example embodiment, impedance may be easily controlled. That is, since the plating thickness of the ground pattern 122 or the volume of the ground pattern 122 may be adjusted in the thickness direction, impedance matching of a product may be easily performed.

One of ordinary skill in the art should recognize that the configuration according to the printed circuit board 100B according to an example embodiment may be applied to the configuration according to the printed circuit board 100A according to another example embodiment. For example, the recesses R may be formed not only in the first insulating layer 111, but also in the second and third insulating layers 112 and 113, and such recesses R may be filled with a signal pattern, a ground pattern, or a power pattern.

One of ordinary skill in the art should also recognize that the configurations described with reference to FIGS. 4 and 5 may be equally applied to the printed circuit board 100B according to an example embodiment.

FIGS. 13 to 16 are process diagrams illustrating the process of manufacturing the printed circuit board in FIG. 12.

Figure 13:
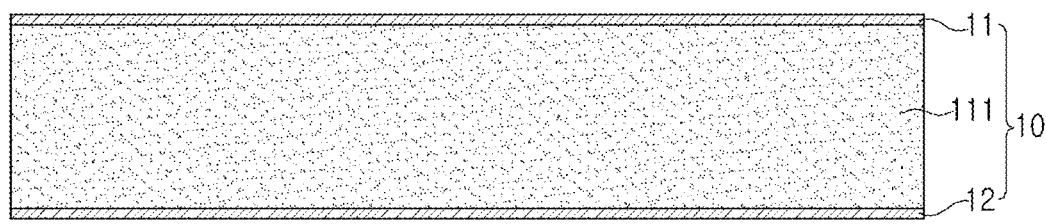
FIGS. 13 to 16 are process diagrams illustrating the processes of manufacturing the printed circuit board in FIG. 12.

Referring to FIG. 13, a copper clad laminate 10 including a first insulating layer 111 and first and second copper foils 11 and 12 disposed on both surfaces of the first insulating layer 111 may be provided.

Figure 14:
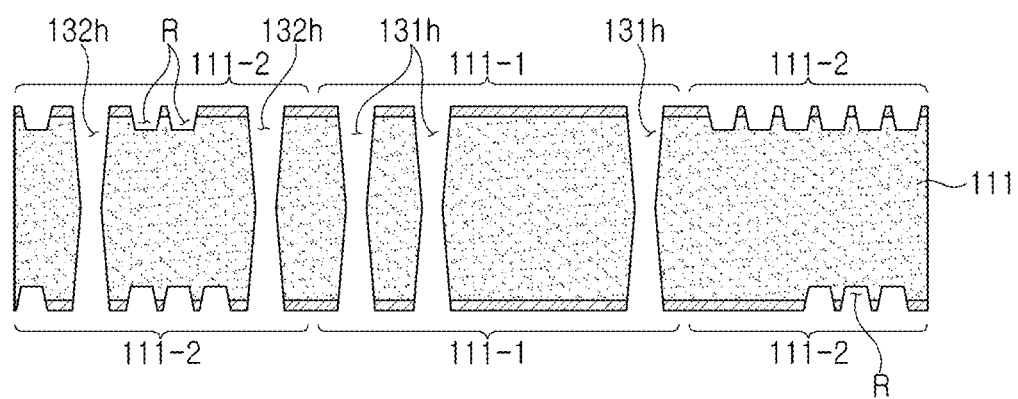

Referring to FIG. 14, by processing both surfaces of the copper clad laminate 10 using a conventional insulating material processing method such as a laser processing method or mechanical drilling, the first and second via holes 131h and 132h and the recess portion R may be formed.

In this case, the first via hole 131h may be formed in the first region 111-1 of the first insulating layer 111, and the second via hole 132h and the recess portion R may be formed in the second region 111-2 of the first insulating layer 111.

Figure 15:
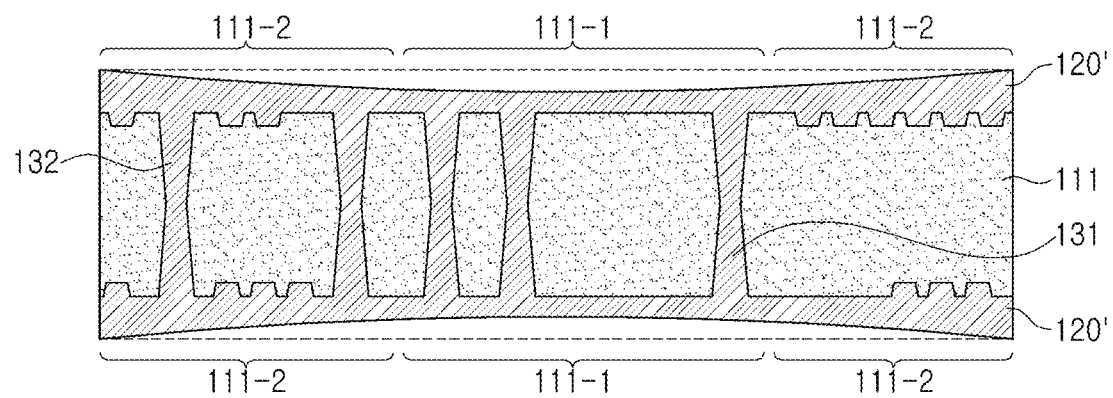

Referring to FIG. 15, as electroless plating and electrolytic plating are performed in order, a plating layer 120' may be disposed on one surface and the other surface of the first insulating layer 111. The plating layer 120' may form the first and second vias 131 and 132, and may fill the recess portion R.

Figure 16:
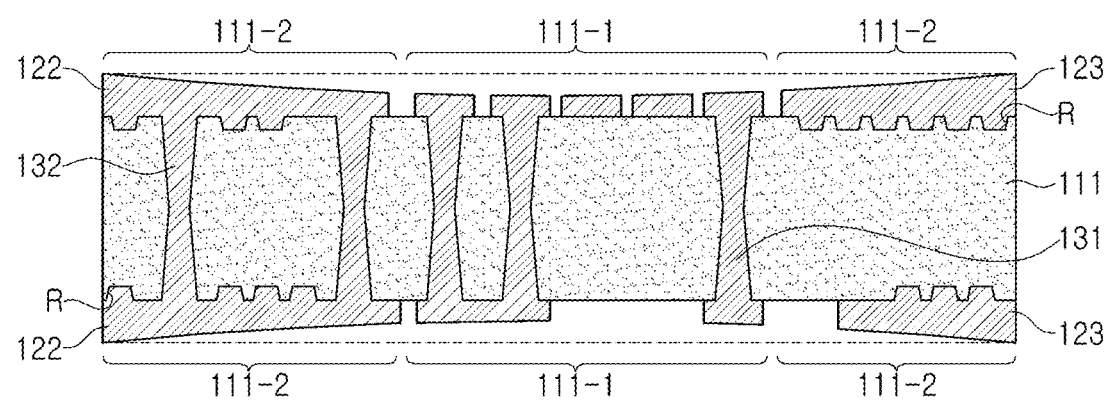

Referring to FIG. 16, a signal pattern 121, a ground pattern 122, and a power pattern 123 may be formed by performing an etching process using a plating resist (not illustrated). In this case, as in the aforementioned example embodiment, the average thickness of at least one of the ground pattern 122 and the power pattern 123 may be greater than the average thickness of the signal pattern 121. A plurality of recess portions R may be disposed and spaced apart from each other below the ground pattern 122 and the power pattern 123, and the recess portion R may be filled with the ground pattern 122 or the power pattern 123.

The other descriptions are the same as in the aforementioned example embodiment, and will thus not be repeated.

According to the aforementioned example embodiments, a printed circuit board having a reduced deviation in plating thickness may be provided.

Also, a printed circuit board having a reduced deviation in plating thickness between an area in which the vias for interlayer connection are concentrated and the other area may be provided.

Further, a printed circuit board in which a deviation in plating thicknesses between the signal pattern and the other patterns is reduced may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
an insulating layer;
a plurality of recess portions disposed on one surface of the insulating layer; and
a circuit layer disposed on the one surface of the insulating layer and including a signal pattern and a ground pattern,
wherein at least a portion of the ground pattern covers at least a portion of at least two of the plurality of recess portions, and
a depth of the plurality of recess portions is less than a thickness of the insulating layer.

2. The printed circuit board of claim 1,
wherein the circuit layer further includes a power pattern disposed on the one surface of the insulating layer, and
wherein at least a portion of the power pattern covers at least another portion of the recess portion.

3. The printed circuit board of claim 2,
wherein the at least portion of the ground pattern is disposed in the at least portion of the recess portion, and
wherein the at least portion of the power pattern is disposed in the at least another portion of the recess portion.

4. The printed circuit board of claim 3, wherein an average thickness of at least one of the ground pattern and the power pattern is greater than an average thickness of the signal pattern.

5. The printed circuit board of claim 3,
wherein the signal pattern includes a signal wiring and a signal pad connected to one end of the signal wiring, and
wherein the signal pad has an average width greater than an average width of the signal wiring.

6. The printed circuit board of claim 5, further comprising:
first and second vias penetrating through at least a portion of the insulating layer,
wherein the first via is in contact with the signal pad, and
wherein the second via is in contact with at least one of the ground pattern and the power pattern.

7. The printed circuit board of claim 6, wherein an average of the shortest distances between the first vias adjacent to each other is less than an average of the shortest distances between the second vias adjacent to each other.

8. The printed circuit board of claim 6, wherein the number of the first vias is greater than the number of the second vias.

9. The printed circuit board of claim 3,
wherein the recess portion is further disposed on the other surface of the insulating layer,
wherein each of the ground pattern and the power pattern is further disposed on the other surface of the insulating layer, and
wherein the recess portion disposed on the other surface of the insulating layer is filled with one of the ground pattern and the power pattern disposed on the other surface of the insulating layer.

10. A printed circuit board, comprising:
an insulating layer;
a circuit layer including a first metal pattern disposed on one surface of a first region of the insulating layer and a second metal pattern disposed on the one surface of a second region of the insulating layer; and
a recess portion disposed in the second region of the insulating layer,
wherein at least a portion of the second metal pattern covers the recess portion, and
wherein an average thickness of the second metal pattern is greater than an average thickness of the first metal pattern.

11. The printed circuit board of claim 10, further comprising:
first vias penetrating through at least a portion of the first region of the insulating layer; and
second vias penetrating through at least a portion of the second region of the insulating layer,
wherein an average of the shortest distances between the first vias adjacent to each other is less than an average of the shortest distances between the second vias adjacent to each other.

12. The printed circuit board of claim 11, wherein the number of the first vias is greater than the number of the second vias.

13. The printed circuit board of claim 10,
wherein the first metal pattern includes a signal pattern, and
wherein the second metal pattern includes at least one of a ground pattern and a power pattern.

14. The printed circuit board of claim 10, wherein a depth of a via in the insulating layer is greater than a depth of the recess portion.

15. The printed circuit board of claim 10, wherein a plurality of the recess portions are provided and spaced apart from each other.

16. A printed circuit board, comprising:
an insulating layer including a first region and a second region; and
a circuit layer including a first metal pattern disposed on the first region, and a second metal pattern disposed on the second region,
wherein the insulating layer includes a plurality of concaves in one of the first region and the second region,
a density of vias in the one of the first region and the second region is less than a density of vias in the other of the first region and the second region, and
the plurality of concaves have a depth less than a depth of the vias.

17. The printed circuit board of claim 16, wherein the plurality of concaves are filled with a corresponding one of the first metal pattern and the second metal pattern disposed on the one of the first region and the second region.

18. The printed circuit board of claim 17, wherein the one of the first metal pattern and the second metal pattern includes a ground pattern or a power pattern, and the other of the first metal pattern and the second metal pattern includes a signal pattern.

* * * * *